United States Patent [19]
Kosonocky

[11] 3,932,775
[45] Jan. 13, 1976

[54] INTERLACED READOUT OF CHARGE STORED IN A CHARGE COUPLED IMAGE SENSING ARRAY

[75] Inventor: Walter Frank Kosonocky, Skillman, N.J.

[73] Assignee: RCA Corporation, New York, N.Y.

[22] Filed: July 25, 1974

[21] Appl. No.: 491,812

[52] U.S. Cl. ............... 307/311; 250/211 J; 250/578; 307/221 D; 307/304; 357/24; 357/30
[51] Int. Cl.² .................. H01L 27/10; H01L 29/78; H01L 31/10
[58] Field of Search ..... 357/24, 30; 250/578, 211 J; 178/6, 7.1, 7.2; 307/221 D, 311, 304

[56] References Cited
UNITED STATES PATENTS

| | | | |
|---|---|---|---|
| 3,777,061 | 12/1973 | Takemura | 357/24 |
| 3,801,884 | 4/1974 | Sequin | 357/24 |
| 3,826,926 | 7/1974 | White et al. | 357/24 |

Primary Examiner—William D. Larkins
Attorney, Agent, or Firm—H. Christoffersen; S. Cohen

[57] ABSTRACT

Charges initially are stored in each half $I_a$ and $I_b$ of each stage of a charge coupled device (CCD) array. A first field is obtained from the charges stored during a first time period by combining the charges in the halves $I_a$ and $I_b$ of each stage. A second field which may be interlaced with the first is obtained from the charges stored during a second time period by combining the charge in the $I_b$ half of each stage with the charge in the $I_a$ half of the following stage. The combining of charges may be performed within the photosensing array to obtain vertical interlacing and within the system output register to obtain horizontal interlacing.

5 Claims, 12 Drawing Figures

FIELD 2
FIG. 3b

FIELD 1
FIG. 3c

INTERLACED READOUT OF CHARGE STORED IN A CHARGE COUPLED IMAGE SENSING ARRAY

Interlacing the patterns read from a charge transfer image sensing array such as one of the charge coupled device (CCD) type provides the advantages of improved resolution and decreased Moire pattern effects. The present application deals with methods and apparatus for achieving vertical and horizontal interlacing of such patterns. One embodiment of the invention includes, in addition, means for reducing blooming.

Figure 1:
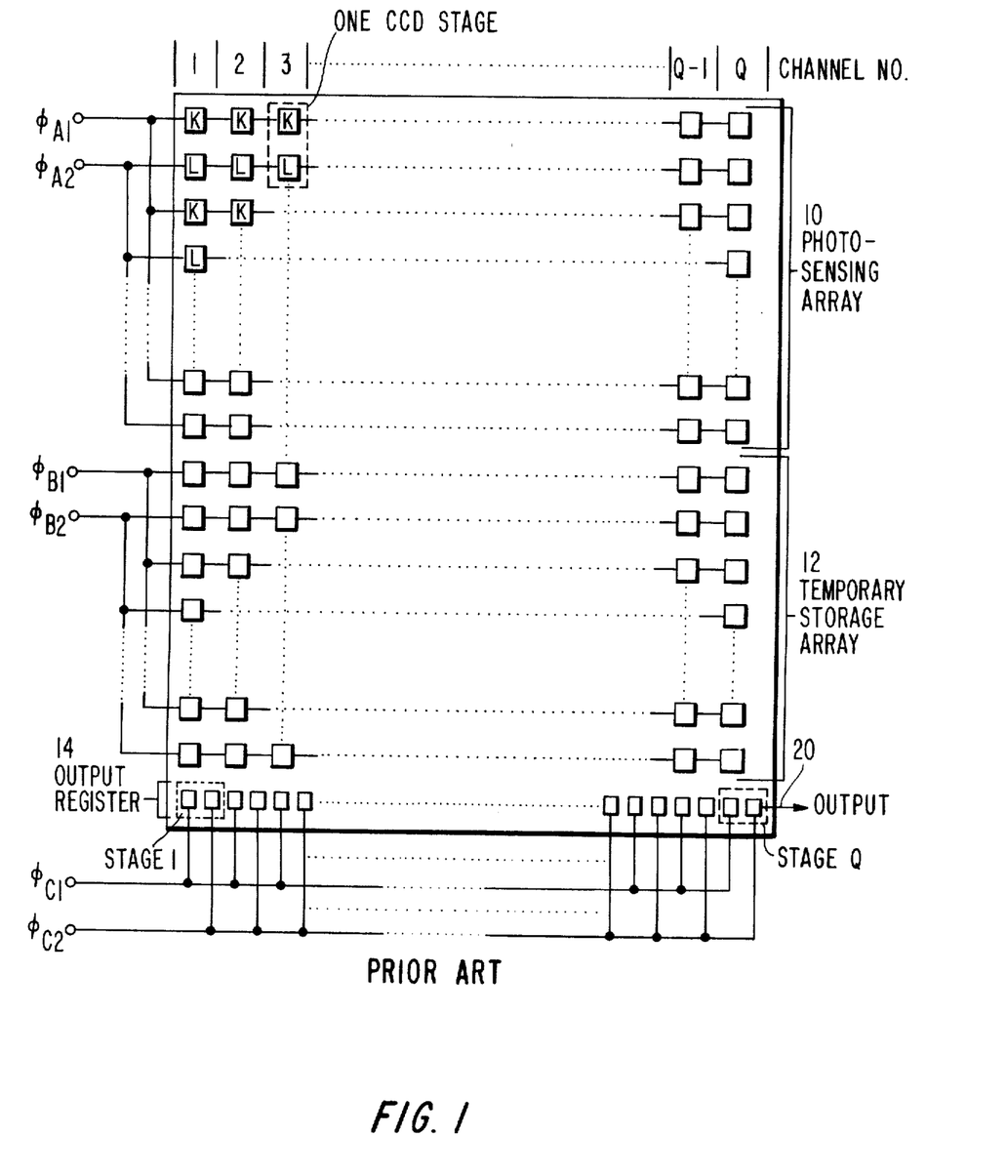
FIG. 1 is a schematic showing of a known charge coupled device image sensing system.
Figure 2:
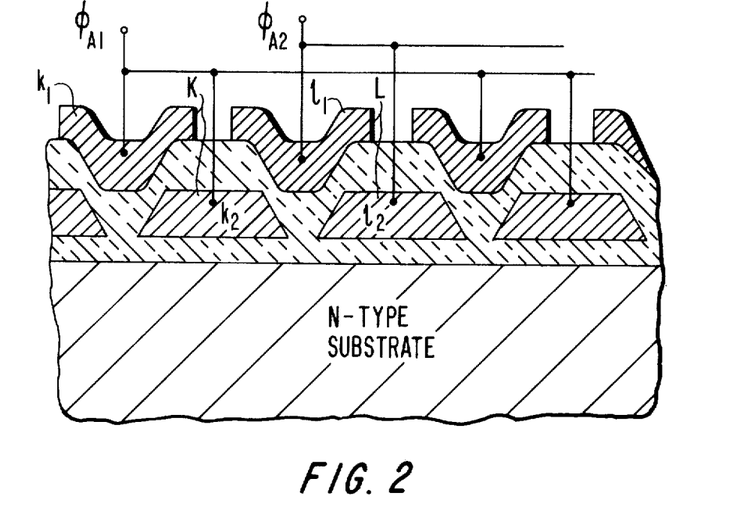
FIG. 2 is a cross section through a portion of a channel of the system of FIG. 1.

The prior art system of FIG. 1, sometimes known as a "frame transfer" charge coupled device (CCD) image sensing system, includes a photosensing array 10, a temporary storage array 12 having the same number of locations as the array 10, and an output register 14 having a number of stages equal to the number of columns in the arrays 10 and 12. Elements 10, 12 and 14 are sometimes known as the A, B and C registers, respectively. In the two phase system illustrated, each stage or location comprises two electrode means K and L. As shown in FIG. 2, an electrode means such as K may, in a two phase system, comprise a pair of electrodes $k_1$ and $k_2$. Electrode $k_2$ may be formed of polysilicon and $k_1$ of polysilicon or aluminum and both are driven by the same voltage phase $\phi_{A1}$. Electrode means L is similar and driven by the other phase $\phi_{A2}$. Here and in the figures which follow, the substrate is assumed to be of N type but it may instead be of P type provided the operating voltages employed are properly chosen.

In the conventional non-interlaced (neither vertical nor horizontal) mode of operation, during the so called "integration" time, comparable to the exposure time in the camera art, the electrode means K may be held at a voltage level to cause potential wells to form at the surface of the substrate. Electrode means L may be held at a voltage level to form potential barriers between the potential wells. Channel "stops", not shown explicitly, are present to prevent the charge in one channel from passing to the next channel. Under those conditions, the radiant energy image, such as a light or an infrared image, as examples, projected onto the array causes the generation and accumulation of charge signal at the respective photosensing locations. The number of charge carriers which accumulate at each location during the integration time is proportional to the amount of radiant energy reaching that location and this, in turn, is proportional to the radiation intensity and the duration of the integration time. The array 12 and register 14 are masked to prevent radiation from reaching these structures.

At the termination of the integration time, the charge carriers are shifted from the photosensing array 10 to the temporary storage array 12. The shifting is accomplished, in the example illustrated, by the two sets of two phase voltages $\phi_{A1}$, $\phi_{A2}$ and $\phi_{B1}$, $\phi_{B2}$. (Four phase operation also would be possible with essentially the same type of gate structure.) During this shifting operation, $\phi_{A1}=\phi_{B1}$ and $\phi_{A2}=\phi_{B2}$. After the information detected by the array 10 has been shifted in its entirety to the temporary storage array 12, it is shifted a line (row) at a time, from the temporary storage array 12 to the output register 14. During the shifting of signals from array 12 to register 14, the photosensing array 10 may be placed in condition again to receive a light image.

The shifting of the contents of array 12 into the register 14 is accomplished by the $\phi_{B1}$, $\phi_{B2}$ two-phase voltages. After each line of information is shifted, in parallel, from array 12 to output register 14, it is then shifted in serial fashion from the output register to the output lead 20 by the two-phase voltages $\phi_{C1}$, $\phi_{C2}$. These, of course, are at a much higher frequency than the two-phase voltages $\phi_{B1}$, $\phi_{B2}$ to insure that register 14 is emptied before the next line of information arrives.

In practice, the contents of the photosensing array 10 may be shifted into the temporary storage array 12 during a period corresponding to the vertical blanking time in commercial television, that is, during a period such as 900 microseconds. The output register 14 may be loaded in say 10 microseconds, the horizontal retrace time, and its contents shifted to the output terminal a bit at a time, during the horizontal line time -50 microseconds.

Vertical interlacing of the information read from the system of FIG. 1 may be achieved in a manner similar to that described by C. H. Sequin in the article "Charge-Coupled Imaging Devices" IEEE, Trans-Elec. Devices, Vol. ED-20, No. 6, June, 1973. During alternate field times, integration of charge takes place under the K electrode means and the L electrode means are held at a voltage level to create barriers between the K electrode means. After the accumulation of charge during the integration time, this charge is shifted, in its entirety, from array 10 to array 12 and then from array 12 to the output register 14, a row at a time, as already discussed.

During the readout of array 12, a second field of information is permitted to accumulate at the photosensing array 10. During this second field, the charge accumulates beneath electrode means L rather than beneath electrode means K, electrode means K being held at a voltage level to create barriers between the electrode means L.

In the system just described, either vertically interlaced or not, there are the same number of stages in output register 14 as there are columns in the array. Thus, in the example shown in FIG. 1, there are Q columns in the array and Q stages in register 14. Each I'th column of the array is shifted into the I'th register stage, where l is an integer having the value of 1, 2, . . .Q.

Figure 3A:
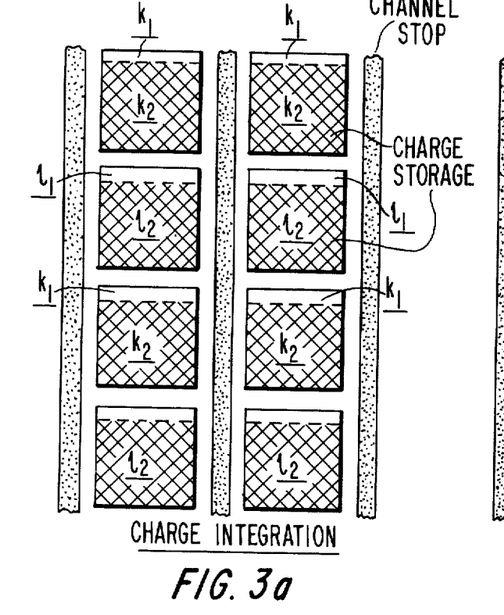
FIGS. 3a, 3b and 3c illustrate schematically a way in which vertical interlacing may be achieved in the system of the present application.
Figure 3B:
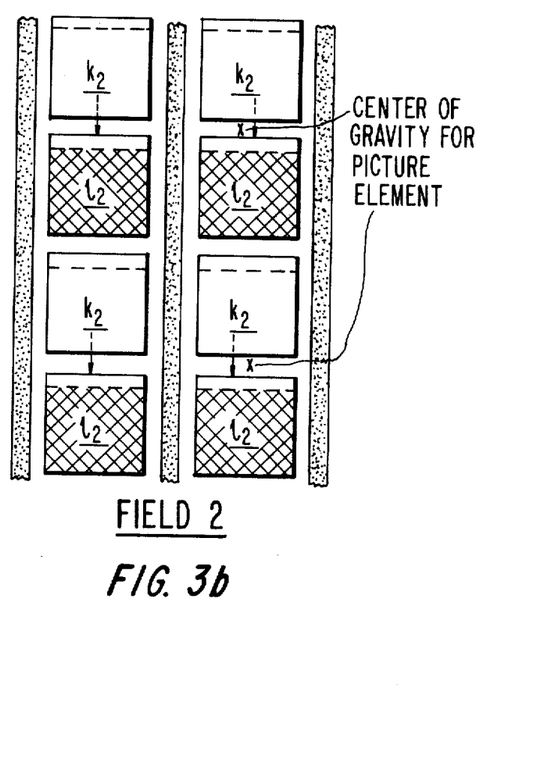
Figure 3C:
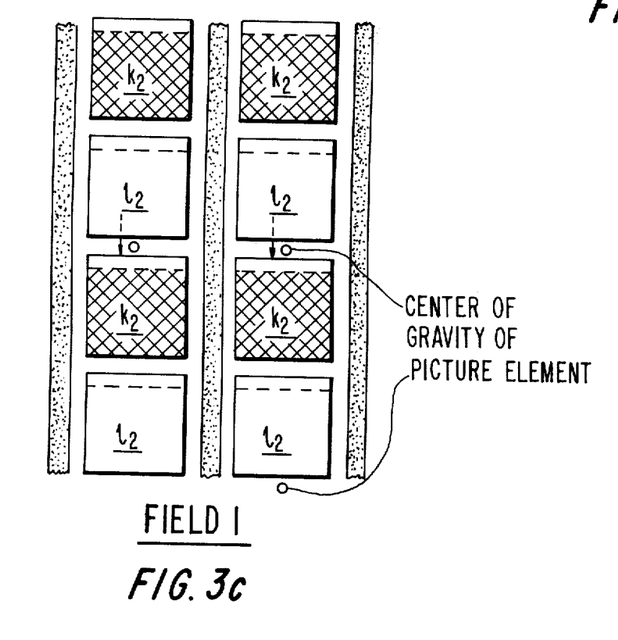
Figure 4:
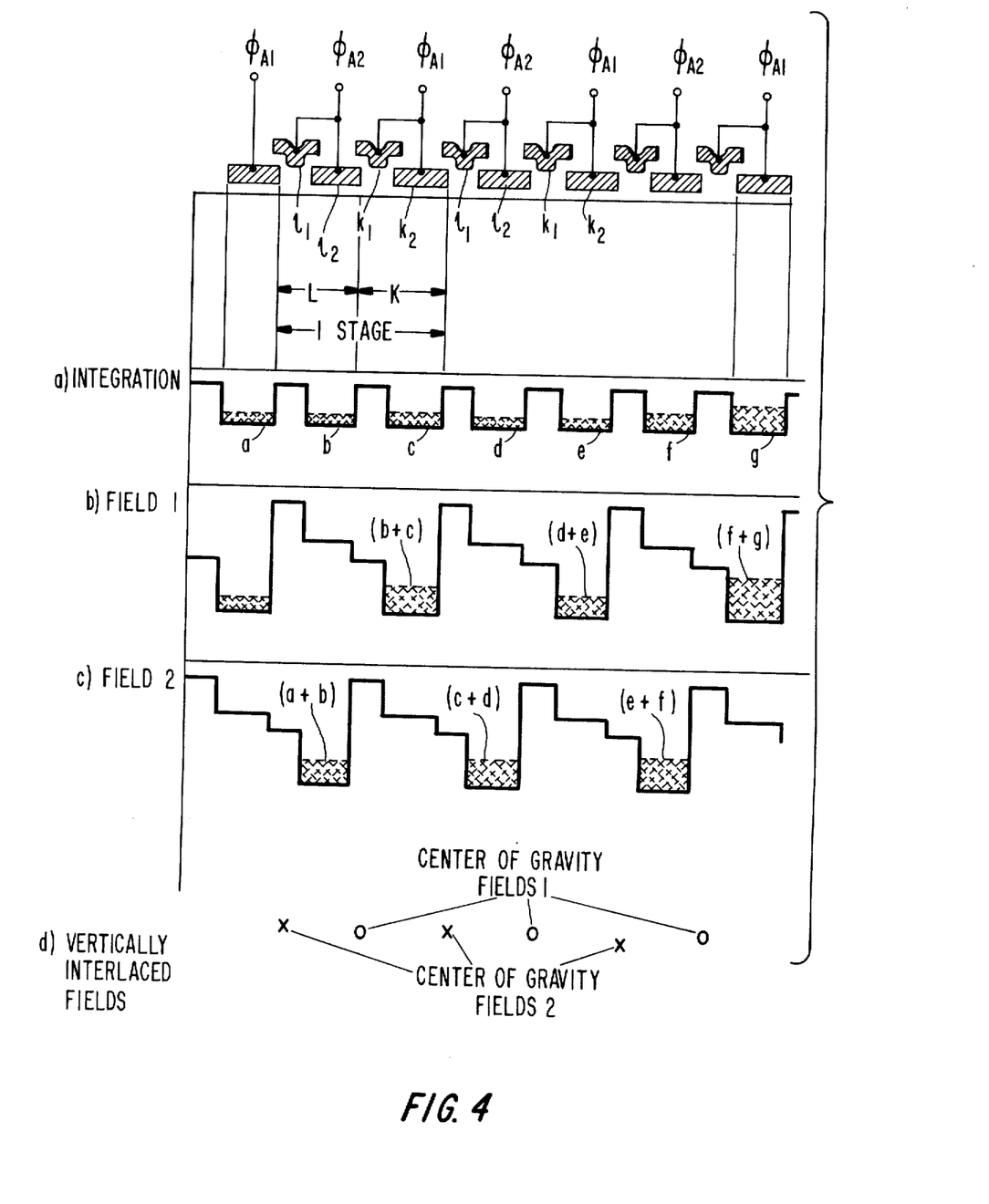
FIG. 4 is a drawing of electrodes and of surface potential profiles to further illustrate vertical interlacing.

FIG. 3 illustrates schematically how vertical interlacing is achieved. Each electrode means is illustrated by a single block with the major part of the block, beneath which charge accumulation occurs, legended $k_2$ or $l_2$ and with a small portion of each block, beneath which the potential barriers are formed, legended $k_1$. FIG. 3a shows the situation during the charge integration time. FIG. 4 shows the same thing at a. The $\phi_{A1}$ and $\phi_{A2}$ potentials are such during the integration time that charge accumulates beneath each polysilicon electrode. Thus, charge accumulates beneath the $l_2$ electrodes and beneath the $k_2$ electrodes. The aluminum electrodes $k_1$ and $l_1$ are spaced sufficiently from the substrate that at the $\phi_{A1}$ and $\phi_{A2}$ potentials employed, potential barriers are present between the potential wells, as illustrated in FIG. 4.

Note that in the present arrangement there are twice the number of potential wells present during the integration time as in the prior art. As will be discussed shortly, after integration the charge present in each pair of wells is combined into a single well. This means that each initial potential well must be relatively shallow (not more than one half that of the well in which each pair of charge signals is later combined). The voltage required to produce these shallow wells is relatively low and this is an important operating advantage. Low voltage employed during the integration time results in relatively small "dark currents." (Dark current refers to the generation of charge signal in response to a stimulus other than the radiation of interest. It can be caused, for example, by heat and it results in what is known as "white video defects" — a form of noise, in the reproduced image.) It has been found experimentally that as the voltage employed during the integration time increases, the dark current spikes increase very rapidly and in non-linear fashion.

Figure 5:
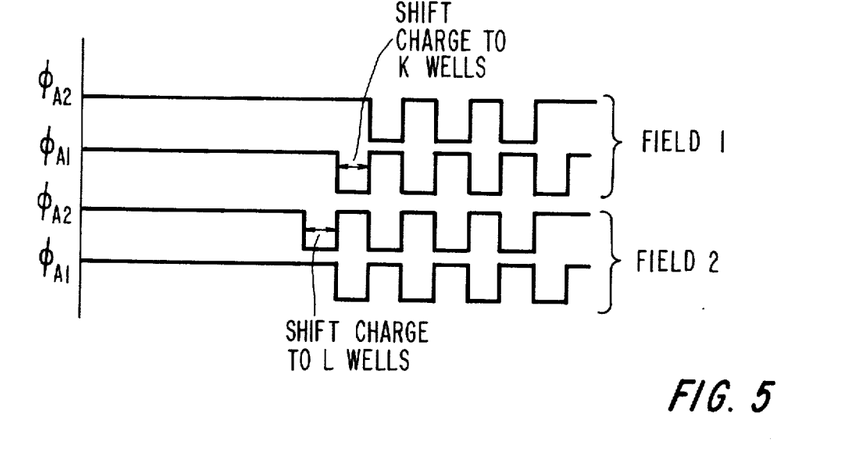
FIG. 5 is a drawing of waveforms employed in the operation depicted in FIG. 4.

FIGS. 3c and 4b illustrate how the information for alternate fields, arbitrarily designated "Field 1" is obtained. At the end of the integration time, voltage applied to the phase one electrodes K is increased while the voltage applied to the phase 2 electrodes L remain unchanged. This is illustrated in the waveforms of FIG. 5 by the arrow legended "SHIFT CHARGE TO K WELLS." The result in this charge in voltage level is to shift the charge formerly present beneath the L electrodes to beneath the K electrodes as indicated by the cross hatching in FIG. 3c.

The field interlaced with the field just described is obtained in similar fashion. Charge is permitted to integrate during a second integration time in the same way as shown in FIGS. 3a and 4a and then is shifted in the manner shown in FIGS. 3b and 4c. Such shifting is accomplished by increasing the voltage applied to the L electrodes while leaving the voltage applied to the K electrodes unchanged. This is also shown in FIG. 5 by the double headed arrow legended "SHIFT CHARGE TO L WELLS."

The last portion of FIG. 4 illustrates schematically at d the vertical interlacing obtained in the manner just described. The crosses represent the "centers of gravity" for the fields arbitrarily designated "Fields 2" and the circles represent the "centers of gravity" for the fields arbitrarily designated "Fields 1".

Figure 6:
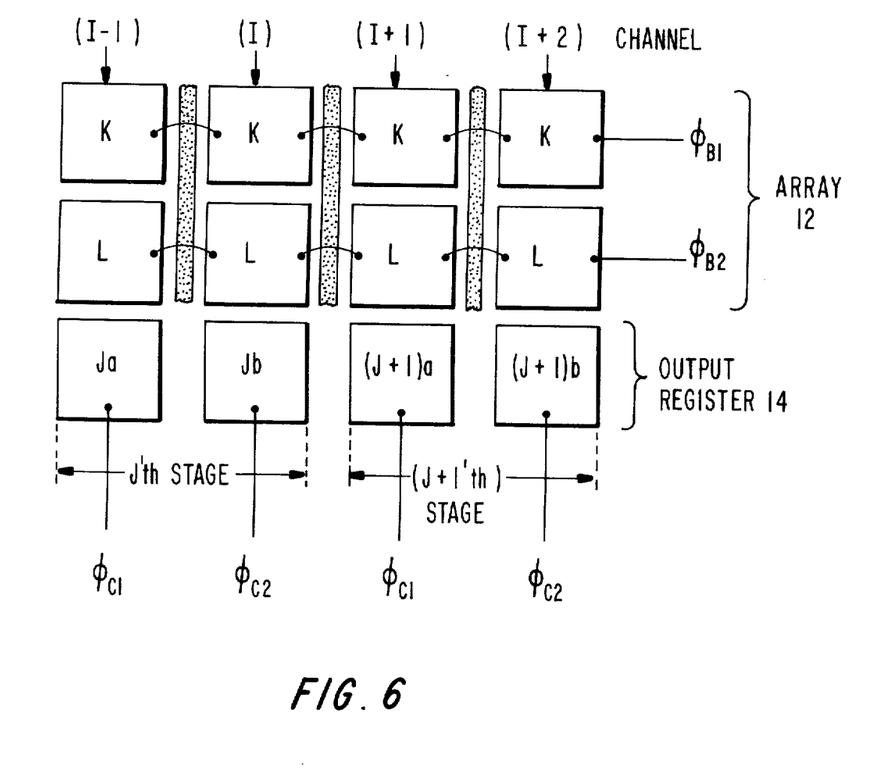
FIG. 6 is a schematic showing of the structure employed for obtaining horizontal interlacing in accordance with an embodiment of the present invention.
Figure 7:
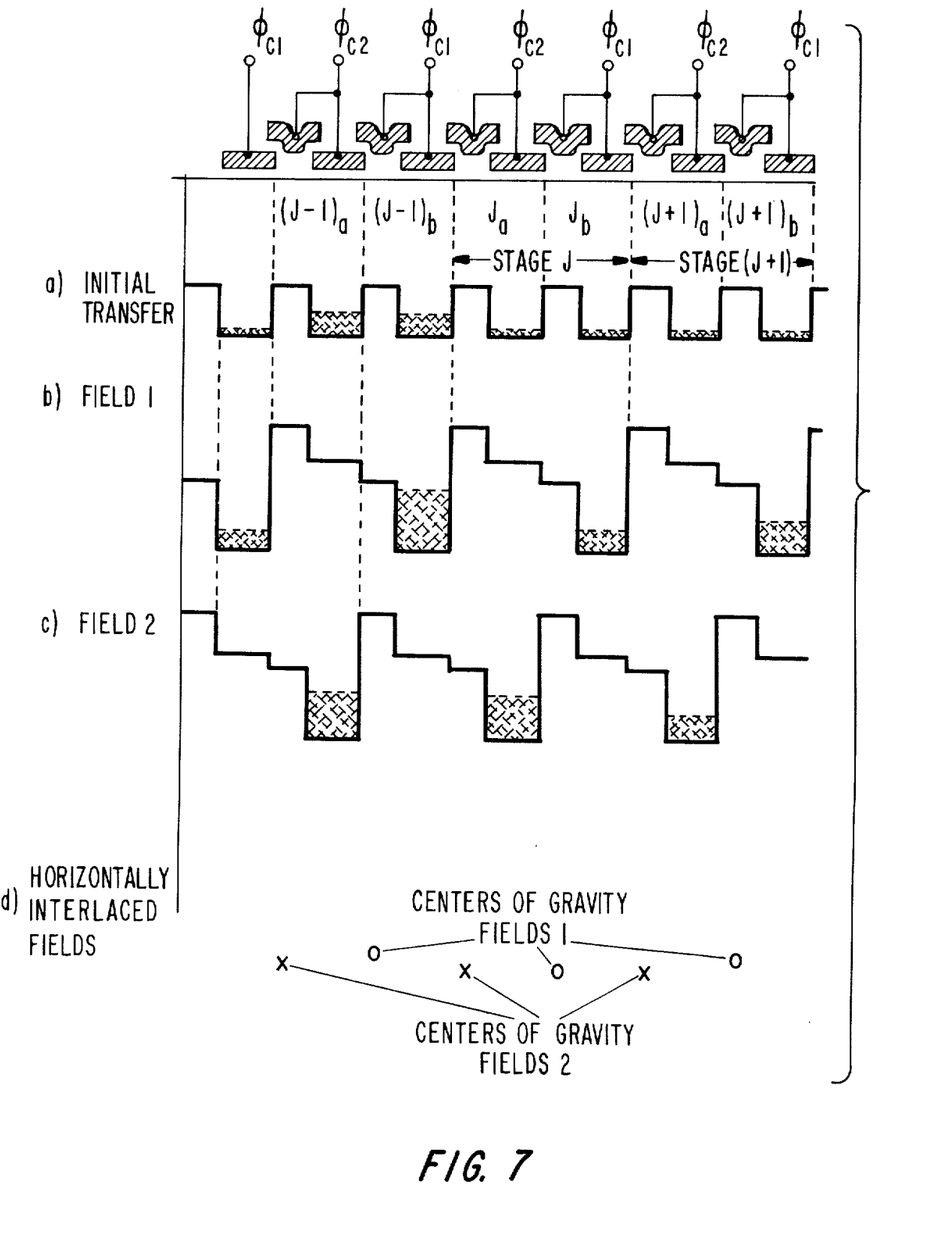
FIG. 7 is a schematic showing of the electrode structure for the output register of FIG. 6 and potential profiles obtained during the operation.

FIG. 6 illustrates in a schematic way the structure by which horizontal interlacing is achieved in the present invention. A portion of the last two rows of the array 12 is shown and a portion of the output register 14 is shown. In the prior art there is one register stage per channel. In the arrangement of the present invention, there is one register stage per two channels, that is, one half register stage per channel. The operation is depicted in FIG. 7. Initially, the $\phi_{C1}$ and the $\phi_{C2}$ voltages are relatively high and are such that potential wells form beneath each electrode which is relatively close to the substrate, and potential barriers form between these wells, that is, beneath each electrode spaced relatively far from the substrate. The surface potential profile is as shown in FIG. 7 at a. When a line of information is transferred to the output register, each potential well becomes filled to an extent dependent upon the amount of charge transferred from the column.

After the initial transfer to the output register 14 of one horizontal line of field 1, the $\phi_{C1}$ and $\phi_{C2}$ voltages first are somewhat reduced (the well and barrier surface potentials both go down but the relative depth of each well remains the same); then the voltage $\phi_{C1}$ is increased while the voltage $\phi_{C2}$ remains at its reduced value. This results in the transfer of charge from each output register half stage subscripted a to the following register half stage subscripted b as shown in FIG. 7 at b. For example, the contents of half stages $J_a$ and $J_b$ are combined in a potential well at the $J_b$ half stage. The charges so accumulated are subsequently shifted out of the output register at high speed, as indicated schematically in FIG. 9. The process continues until the entire field 1 has been shifted, one line at a time, into the output register and then serially shifted out of the output register.

The horizontal field interlaced with the field above is obtained in a fashion similar to that described above. After a second integration time, the initial transfer is the same as shown in FIG. 7a. However, the charges accumulated next are shifted to beneath the half stages subscripted a from the preceding half stages subscripted b. For example, as shown in FIG. 7 at c, the contents of the $(J-1)_b$ half stage is shifted to the $J_a$ half stage and the shifting is accomplished by first reducing $\phi_{C1}$ and $\phi_{C2}$, then making the $\phi_{C2}$ voltage relatively high while retaining the $\phi_{C1}$ voltage at its reduced value. This process continues until the entire field 2 has been shifted one line at a time into the output register and then serially shifted out of the output register.

FIG. 7 illustrates at d the horizontal interlacing obtained in the manner just discussed. The circles represent the "centers of gravity" of alternate fields arbitrarily designated "Fields 1" and the crosses represent the "centers of gravity" of the fields arbitrarily termed "Fields 2".

Figure 8:
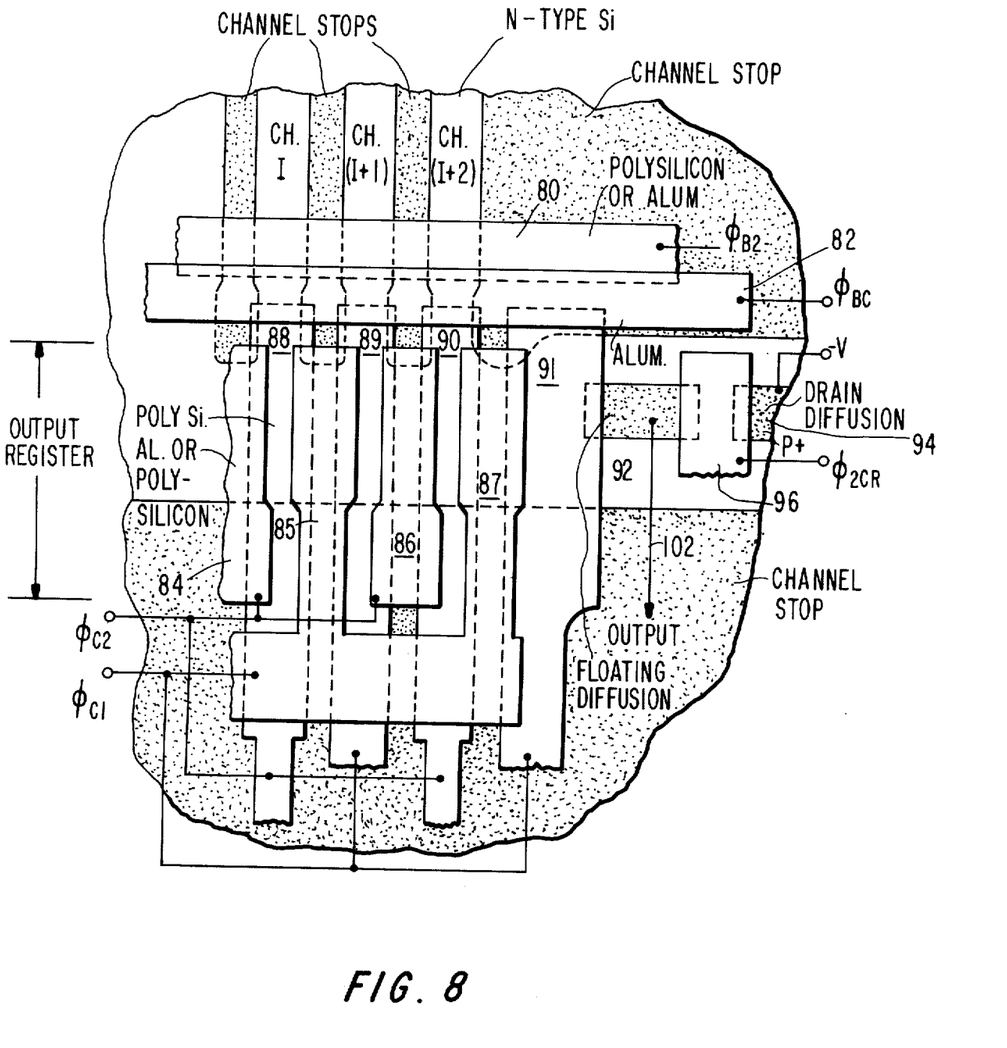
FIG. 8 is a somewhat simplified, more realistic showing of an output register which may be employed in an embodiment of the invention.

FIG. 8 illustrates the output register in a more realistic fashion then the previous figures. The polysilicon electrode of the last row of the temporary storage array 12 is shown at 80. This electrode is overlapped by a second electrode 82 which may be formed of polysilicon or aluminum, as examples. The output register comprises polysilicon or aluminum electrodes such as 84–87 and polysilicon electrodes such as 88–91. The output register also may include a floating diffusion 92, a drain diffusion 94 and a gate electrode 96.

Figure 9:
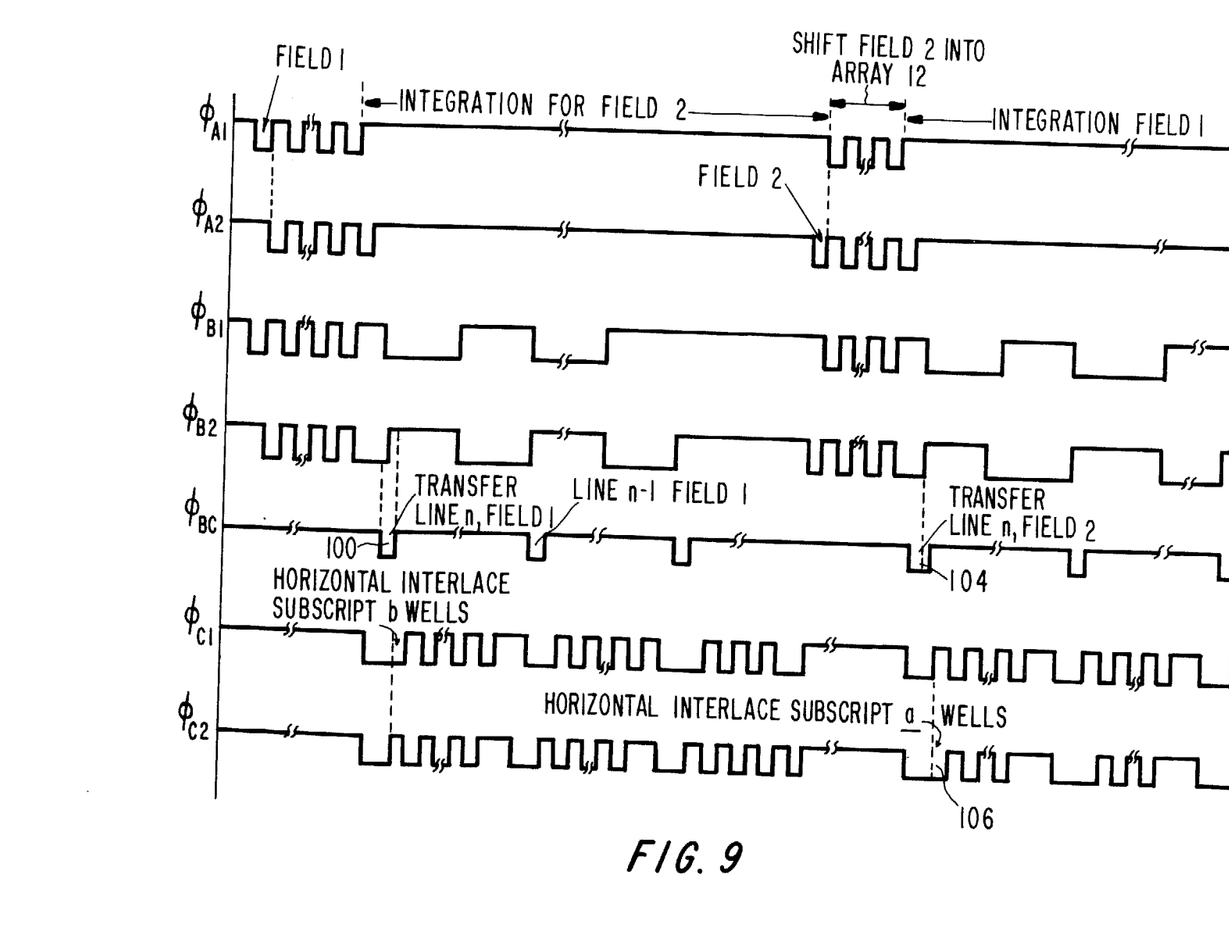
FIG. 9 is a drawing of waveforms employed in the operation of embodiments of the invention.

In the discussion of the operation of FIG. 8 which follows, both FIGS. 8 and 9 should be referred to. When a row of charge signal reaches the last polysilicon electrode 80, the transfer electrode 82 receives a negative voltage pulse $\phi_{BC}$ as shown, for example, at 100 in FIG. 9. This pulse 100 goes negative during the time $\phi_{B2}$ is negative and remains negative after $\phi_{B2}$ goes relatively positive. Timing in this way prevents charge which has transferred to the output register from propagating back toward the channels. Both $\phi_{C1}$ and $\phi_{C2}$ are negative during at least some part of the negative pulse $\phi_{BC}$. This assures that at the end of the negative pulse $\phi_{BC}$, the row of charge transfers to the output register 14. The voltage level at 100 may be such that the potential well beneath electrode 82 is shallower than that beneath the polysilicon electrodes of the output register and deeper than that beneath the polysilicon electrode 80.

After the pulse 100 terminates, the $\phi_{C2}$ voltage goes relatively positive while the $\phi_{C1}$ voltage remains relatively negative. The effect is to shift the contents of the half stage driven by the $\phi_{C2}$ electrodes to beneath the $\phi_{C1}$ electrodes. This is somewhat different than the operation depicted in FIG. 7 but the effect is the same. In FIG. 7 the surface potential under all electrodes subscripted b initially high. Combining is achieved by first decreasing $\phi_{C1}$ and $\phi_{C2}$ to decrease the surface potentials under the b electrodes then increasing one of the phase voltages (making it more negative) while the other phase voltage remains at its reduced value; in FIG. 9 combining is achieved by decreasing one of the phase voltages (making it relatively more positive) while the other phase voltage remains unchanged.

After the combining of the charge just described, the combined charges are shifted at high speed out of the register 14. Each time a charge reaches the floating diffusion 92, it causes a signal to be present at output lead 102 which leads to an output amplifier stage (not shown). A short time later, the gate electrode 96 is activated to form a conduction channel between the floating diffusion 92 and the drain diffusion 94 to reset the drain diffusion 92 to a reference level. The remainder of the operation is believed to be clear from the waveforms of FIG. 9.

The start of the transfer of rows which comprise field 2, to the output register is indicated by the $\phi_{BC}$ pulse 104. The combining of the transferred charge from the two half stages subscribed b to those subscripted a is as depicted in the region 106 of the $\phi_{C2}$ wave of FIG. 9. The remainder of the operation is believed to be self-evident from FIG. 9.

Figure 10:
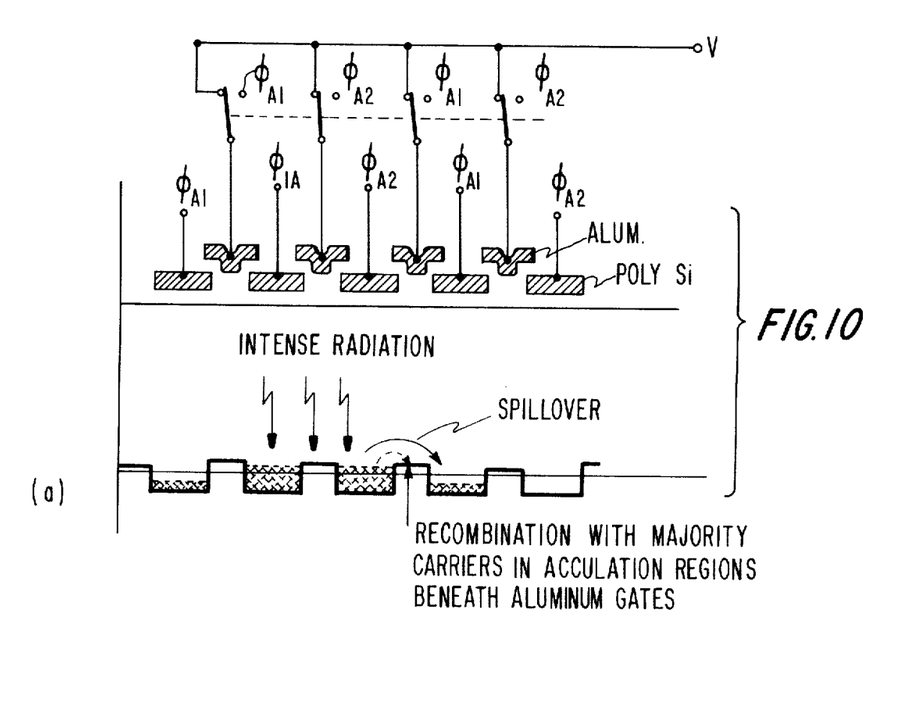
FIG. 10 is a schematic showing of the electrode structure and potential profiles produced in an embodiment of the invention where a degree of blooming control is achieved.

FIG. 10 illustrates structure for reducing blooming during the vertical interlacing discussed in connection with FIGS. 3 - 5. The substrate still is assumed to be of N type. In the arrangement of FIG. 10, during the integration time the aluminum electrodes are held at a voltage V which is sufficiently relatively positive to cause accumulation of majority carriers (electrons) to occur in the substrate. This voltage may be of value such as zero volts (assuming the substrate to be at zero volts) or as some small positive value (say 1 – 5 volts). Should intense radiation occur as indicated by the legend, then some of the minority carriers (diodes) which would otherwise tend to overflow a potential well to the adjacent potential wells will start recombining with the majority carriers in the accumulation regions beneath the aluminum gates, as indicated in FIG. 10. When it is desired to combine and then propagate the charge signals, as already described, the aluminum electrodes are connected to the multiple phase voltage terminals, as indicated schematically by the mechanical switches. In practice, of course, electronic switches and circuits are employed, rather than mechanical switches.

While in the discussion above, both horizontal and vertical interlacing of charge patterns are considered, it is to be understood that the present invention is applicable to each individually and to both in combination. Thus, it is useful just to vertically interlace without horizontally interlacing and just to horizontally interlace without vertically interlacing. However, in practice, the preferred mode of operation is to employ both horizontal and vertical interlacing because it results in improved resolution in two dimensions and in a reduction in both vertically and horizontally induced Moire patterns.

While the present invention has been described in terms of a CCD image sensing system using a N type substrate, it is to be understood that it is equally applicable to systems using P type substrates. The invention is to be understood to be applicable both to surface channel and buried channel CCD systems, except for the embodiment of FIG. 10 which is mainly applicable to surface channel systems. Also, while the invention has been illustrated in terms of a two-phase system, the concepts are applicable also to four-phase systems that can be constructed with a similar gate structure.

While the invention has been illustrated in terms of a particular form of two-phase electrode structure, it is to be understood that this is given by way of example only. A number of other alternatives are possible. For example, the asymmetrical potential wells required for insuring unidirectional signal propagation, may be obtained by placing one electrode of each pair at a different direct voltage bias level then the other electrode of each pair. In this configuration, the aluminum electrodes may be spaced the same distance from the substrate as the polysilicon electrodes or further from the substrate then the polysilicon electrodes. Asymmetric potential wells also may be achieved by placing charge either in the substrate beneath one of the electrodes of each electrode pair or by employing suitable insulation with built in charge which is a different value beneath one electrode of a pair then beneath the other electrode of a pair. A two-phase CCD with ion implanted barriers is an example of this type. It is also to be understood that while in the present example the electrodes are shown to be formed all of polysilicon or of aluminum and polysilicon, other alternatives are available. For example, metals other than aluminum may be employed. When all polysilicon electrons are employed, aluminum connections may be used for the electrodes as well as for the source and drain diffusions and substrate. It is also to be understood that the array can be illuminated through the electrodes, or the substrate can be thinned and the arrays illuminated from the bottom surface.

In the operation of arrays such as discussed, it is important that the fields, when they are displayed on a display device such as a kinescope, appear in the same relative positions as the centers of gravity of the fields during the integration times for the respective fields. Such operation may be obtained by relatively delaying the fields 2 with respect to the fields 1 prior to displaying the fields by an amount such that each second field interlaces with each first field; that is, each line of a second field lies halfway between two adjacent lines of a first field. The same effect may be achieved by appropriate timing of the synchronization pulses for the lines of the respective fields. All of this is similar, in principle to what is done in commercial television.

In the embodiments of the invention discussed above which employ horizontal interlacing, each line of a given field is in the same horizontal position but one field is shifted horizontally relative to the other. It is also possible in the present invention to change the horizontal position of the lines from one line to the next during a single field in the manner suggested in the concurrently filed U.S. application Ser. No. 491,836, titled Interlaced Readout of Charge Stored in Charge-Coupled Image Sensing Array, by Peter A. Levine and James E. Carnes, assigned to the same assignee as the present application.

What is claimed is:

1. A method for obtaining interlaced fields of charge signal from an array of charge signal stages, where each such stage includes two half stages $I_a$ and $I_b$ comprising the steps of:

initially storing charge signal at each half $I_a$ and $I_b$ of each stage of the array;

for a first field, combining the charge in the halves $I_a$ and $I_b$ of one stage into one of these half stages before shifting the combined charge signal out of the array; and for a second field, to be interlaced with the first, combining the charge signal in the $I_b$ half of one stage with the charge signal in the adjacent $I_a$ half of an adjacent stage, before shifting the combined charge signal out of the array.

2. The method of claim 1 wherein said array comprises a change coupled image sensing array having channels extending in the column direction along which the charge signals are shifted, and wherein there is an output register having a number of stages equal to half the number of columns in the array, each half stage of the register coupled to a different column of the array, including the further steps of:

shifting, a row of information at a time, derived from the array, into the output register, with the charge signal from each column passing to a different half stage of the output register;

for a first field to be horizontally interlaced with a second field defined below, combining the charge signal in the halves $J_a$ and $J_b$ of each register stage before shifting the charge signal out of the register;

for said second field to be horizontally interlaced with the first, combining the charge signal in the half $J_b$ of one register stage with that in the half $J_a$ of the following register stage before shifting the charge signal out of the register.

3. A charge coupled image sensing system comprising:

an array of stages, each including a half stage $I_a$ and a half stage $I_b$, each half stage including means responsive to radiation for producing a charge signal;

means for applying voltages to each half stage during first and second integration times for causing each half stage to store charge signal;

means for producing a first field, after said first integration time, comprising means for controlling the value of said voltages for shifting the charge signal stored in each half stage $I_a$ to the following half stage $I_b$, and for shifting the combined charge signals stored in the half stages means, after said second integration time, for producing a second field which may be interlaced with the first, comprising means for controlling the value of said voltages for shifting the charge signal stored in each half $I_b$ of one stage to the half $I_a$ of the following stage, and then shifting the combined charge signals stored in the half stages $I_a$ out of the array.

4. A system as set forth in claim 3, wherein said array includes a semiconductor substrate and wherein each half stage comprises two electrodes, the first for forming a potential well in the substrate and the second for forming a potential barrier between the well of that half stage and the well of the adjacent half stage.

5. A system as set forth in claim 4 further including means for maintaining each second electrode, during each integration time, at a voltage such that the accumulation of majority carriers occur in the regions of the substrates beneath these second electrodes, whereby the tendency for blooming to occur is lessened.

* * * * *